US 6,567,717 B2

(12) United States Patent
Krivokapic et al.

(10) Patent No.: US 6,567,717 B2
(45) Date of Patent: *May 20, 2003

(54) FEED-FORWARD CONTROL OF TCI DOPING FOR IMPROVING MASS-PRODUCTION-WISE, STATISTICAL DISTRIBUTION OF CRITICAL PERFORMANCE PARAMETERS IN SEMICONDUCTOR DEVICES

(75) Inventors: Zoran Krivokapic, Santa Clara, CA (US); William D. Heavlin, El Granada, CA (US)

(73) Assignee: Advanced Micro Devices, Inc., Sunnyvale, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/487,548

(22) Filed: Jan. 19, 2000

(65) Prior Publication Data

US 2003/0014144 A1 Jan. 16, 2003

Related U.S. Application Data

(63) Continuation-in-part of application No. 09/487,549, filed on Jan. 19, 2000.

(51) Int. Cl.[7] .............................................. G06F 19/00
(52) U.S. Cl. ...................................... 700/121; 438/14
(58) Field of Search ................................. 700/121, 117, 700/123; 438/14, 5, 7, 9, 16; 382/141

(56) References Cited

U.S. PATENT DOCUMENTS

| 5,270,222 | A | * | 12/1993 | Moslehi | ........................... 438/7 |
| 5,467,883 | A | * | 11/1995 | Frye et al. | ..................... 216/60 |
| 5,773,174 | A | * | 6/1998 | Koizumi et al. | ............... 430/30 |
| 5,841,651 | A | * | 11/1998 | Fu | ................................ 700/48 |
| 6,055,460 | A | * | 4/2000 | Shopbell | ...................... 700/121 |
| 6,161,054 | A | * | 12/2000 | Rosenthal et al. | ........... 700/121 |
| 6,311,096 | B1 | * | 10/2001 | Saxena et al. | ............... 700/121 |
| 6,388,253 | B1 | * | 5/2002 | Su | .............................. 250/310 |

* cited by examiner

*Primary Examiner*—Leo Picard
*Assistant Examiner*—Zoila Cabrera
(74) *Attorney, Agent, or Firm*—Fliesler Dubb Meyer & Lovejoy LLP

(57) ABSTRACT

When Tilted Channel Implant (TCI) is performed on transistor precursor structures having an etch-defined gate length ($L_{2M}$) and a trim-defined sidewall thickness ($S_{wM}$), mass production deviations may cause errors between targeted values for these critical dimensions (CD's) and the correspondingly measured CD's. These deviations may respectively cause shifts in the lateral placement of TCI dopants or in the depth of implant of the TCI dopants, thereby tending to cause variation in final device characteristics. Countering adjustments to TCI dosage and TCI energy are automatically made in accordance with the invention. These countering adjustments in the TCI process enable expansion of tolerance ranges in pre-TCI production steps, thereby increase manufacturing yield.

19 Claims, 5 Drawing Sheets

Isotropic Trim of PR Gate Predecessor and DICD Measurement of L2

Anisotropic Formation of Gate and FICD Measurement of L2' (=$L_{2M}$)

Gate Coated with Spacer Material

Anisotropic Etch-down, followed by Isotropic Lateral Trim of Gate Spacer, and Measurement of $S_{Wm}$ TIC Formation of P Gradient with Self-Align to Actual Dimensions, $L_{2A}$ and $S_{wA}$

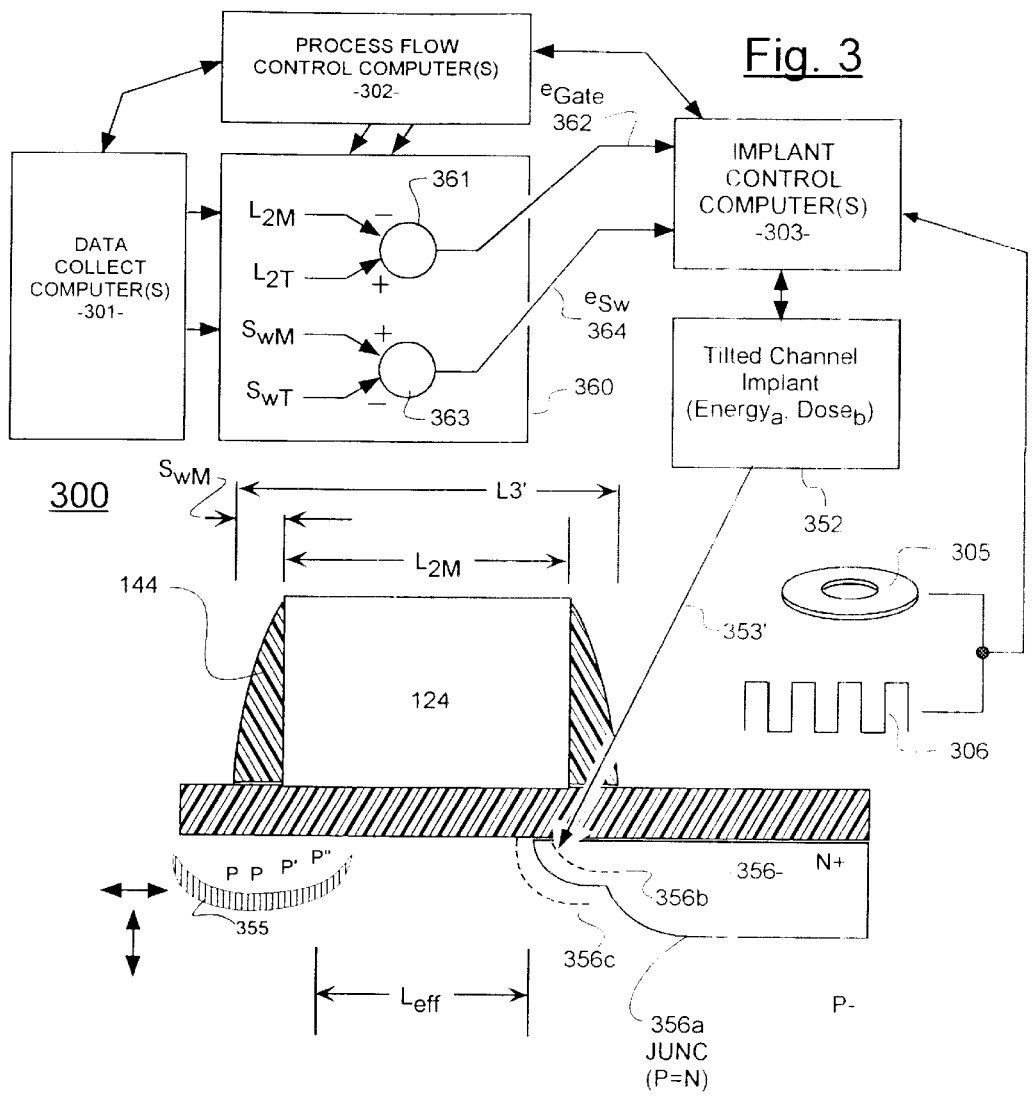
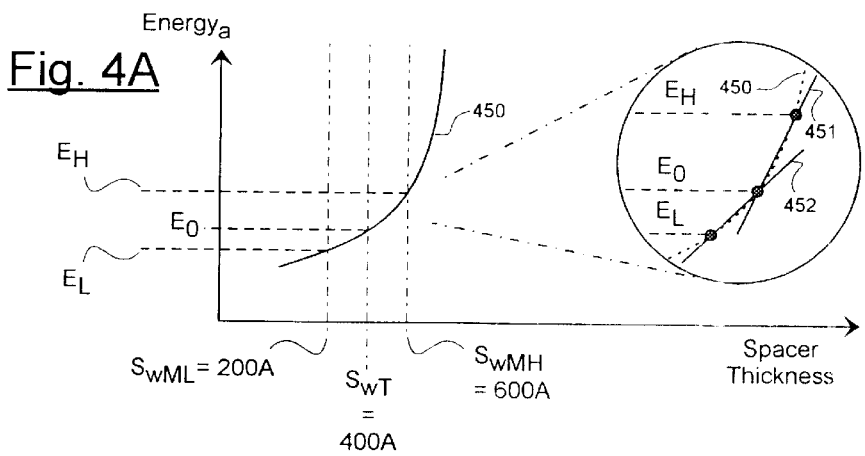
Fig. 4A 500 (cont'd)

FEED-FORWARD CONTROL OF TCI DOPING FOR IMPROVING MASS-PRODUCTION-WISE, STATISTICAL DISTRIBUTION OF CRITICAL PERFORMANCE PARAMETERS IN SEMICONDUCTOR DEVICES

CROSS-REFERENCE TO CO-OWNED PATENT APPLICATIONS

This application is a concurrent continuation-in-part of U.S. patent application Ser. No. 09/487,549, filed Jan. 19, 2000 which application is owned by the owner of the present application and which application is concurrently filed herewith on behalf of the same inventors, Zoran Krivokapic and William D. Heavlin, and which parent application is initially entitled FEED-FORWARD CONTROL OF TCI DOPING FOR IMPROVING MASS-PRODUCTION-WISE, STATISTICAL DISTRIBUTION OF CRITICAL PERFORMANCE PARAMETERS IN SEMICONDUCTOR DEVICES, and whose disclosure is incorporated herein by reference.

BACKGROUND

1. Field of Invention

The invention is generally directed to the mass production of semiconductor devices. The invention is more specifically directed to the problem of tightening statistical variation of critical performance parameters during mass production of semiconductor devices, where the fabrication process includes TCI (Tilted Channel Implant) doping.

2a. Cross Reference to Issued Patents

The disclosures of the following U.S. patents are incorporated herein by reference:

(A) U.S. Pat. No. 5,926,690 issued Jul. 20, 1999 to Toprac, et al, and entitled, Run-to-run Control Process for Controlling Critical Dimensions; and (B) U.S. Pat. No. 5,863,824 issued Jan. 26, 1999 to Gardner, et al, and entitled, Method of Forming Semiconductor Devices Using Gate Electrode Length and Spacer Width for Controlling Drive Current Strength.

2b. Description of Related Art

A mass-production tolerance problem emerges as the historically-consistent, and industry-pervasive, shrinkage for the effective length ($L_{eff}$) of transistor channels continues on to smaller and smaller dimensions. Statistical variations tend to crop up over time in the mass-production processes that ultimately define effective channel length ($L_{eff}$). Of importance, such statistical variations show up in what may be termed as critical dimensions (CD's) of in-process structures.

More specifically, it is predicted that shrinkage of dimensions will continue as it had in the past, with the implementation of ever smaller dimensions of channel length, such as moving from devices with channel lengths of about $0.25\mu$ (0.25 micron) or less, down to devices with channel lengths of about $0.18\mu$ or less, and then continuing down to devices with channel lengths of about $0.09\mu$ or less, and perhaps continuing to even substantially smaller dimensions. As these dimensions shrink, the so-called critical dimensions' (CD's) of transistor-precursor structures (which structures appear during mass-production) become more and more difficult to control with precision. At the same time, the mass-production replication of such CD's becomes more significant to final device performance as channel length dimensions shrink. New methods are needed for providing tighter process control of critical performance parameters so that desired statistical mean and 3 sigma ($3\sigma$) values can be obtained for mass-produced devices.

One factor that can play a substantial role in determining the ultimate $L_{eff}$ of each individual one of mass-produced transistors is the precision with which the actual length of the patterned gate material (e.g., polysilicon) can be controlled. This patterned gate material is that which remains in the transistor-precursor structure after completion of mass-production photomasking, mass-production resist trimming, and mass-production gate-material etch.

Another factor that can play a role in determining the ultimate $L_{eff}$, in cases where sidewall spacers are formed and trimmed about the post-etch gate, is the precision to which the deposition and trimming of such sidewalls is carried out.

The interplay between such factors will become more apparent when the drawings are described in detail below. For now, it is sufficient to understand how, in a conventional fabrication process, an ideal or target value ($L_{GateT}$) is established for the final length of the gate material that remains after gate-layer etching. Due to statistical process variations, and even though the measured, actual gate length (the gate FICD) will tend to have an average or mean value that is close to the ideal or target value ($L_{GateT}$), individually-sampled dice or wafers or lots will tend to exhibit gate FICD's (Final Inspection measurements of Critical Dimension) that deviate by finite amounts from the target value. In other words, there will typically be a manufacturing tolerance error that may be expressed as:

$$e_{Gate} = L_{GateT} - FICD \qquad \{\text{Eq. 1}\}.$$

The group of fabrication technicians and/or other personnel who are responsible for keeping the post-etch gate length (as measured by FICD) close to the established ideal or target value ($L_{GateT}$), will typically define an allowed tolerance-range, $e_1 \leq e_{Gate} \leq e_2$ (where $e_1$ is typically less than zero while $e_2$ is greater than zero). Nonconforming, post-etch wafers will usually be thrown away.

If, at a given time during production, a statistically significant number of FICD measurements begin to fall outside the predefined, allowed tolerance-range, $e_1 \leq e_{Gate} \leq e_2$, then production might need to be temporarily halted to find out why there is an such an unusual increase in the number of nonconforming, post-etch wafers. Specialty personnel (e.g., gate-etch control engineers) may have to be called in to determine what, if any, fine tunings should be made to the gate-etch process to bring its statistical results (mean and $3\sigma$ deviation) back to acceptable numbers.

This is risky business. Sometimes an observed set of extreme deviations is just a random coincidence and the correct response (as can be shown only by hindsight) is to leave the gate-etch process unchanged. If a fine-tuning is nonetheless applied, that tuning may itself, over time, cause an even larger number of wafers to fall outside the allowed tolerance-range, $e_1 \leq e_{Gate} \leq e_2$.

Further downstream along the mass-production line, there may be a second group of fabrication personnel who are responsible for applying (depositing) and trimming down, gate sidewalls. This second group will face a similar dilemma. They will establish statistical mean and allowed deviation ranges for sidewall film thickness and trim-down distance. The allowed range may be expressed as, $e_3 \leq e_{Sidewall} \leq e_4$, where $e_{Sidewall}$ is the error between measured and target thickness dimensions for the gate sidewalls, and $e_3$ is typically less than zero while $e_4$ is greater than zero. Nonconforming, post-trim wafers may have to be thrown away or stripped and re-worked.

If a statistically significant number of sidewall-thickness measurements begin to come back as falling outside the allowed tolerance-range, $e_3 \leq e_{Sidewall} \leq e_4$, then production might need to be temporarily halted. Specialty personnel (e.g., sidewall-deposition and trim control engineers) may have to be called in to determine what, if any, fine tunings should be made to the sidewall-deposition and/or sidewall-trim processes to bring their statistical results (mean and 3σ deviation) back to acceptable numbers. Like the case involving fine tuning of the gate-etch process, fine tuning of the sidewall-deposition and/or sidewall-trim processes is risky business. Sometimes an observed set of extreme deviations is just a random coincidence and the correct response is to leave the sidewall-related processes unchanged. If a fine-tuning is nonetheless applied, that tuning may over time, push an even larger number of samples outside the allowed tolerance-range.

It is seen from the above that CD measurement practices and statistical analysis and response practices can produce dilemmas. On the one hand, semiconductor manufacturers want to obtain good yield of final product in as little time as possible. On the same hand, they want to avoid the costs of human intervention. On the other hand, they want to avoid the possible errors of human judgment that might come to play with constant, manually-determined fine tunings to each gate etch or sidewall deposition or sidewall trim process. To achieve the end result of avoiding judgment errors, it has been generally accepted that the gate FICD's (measured critical dimensions) must be maintained within very tight tolerances, even if that goal leads to a throwing away of large numbers of post-etch wafers. But that means that yield suffers. It is a situation that leaves practitioners in a can't-win dilemma. They can suffer yield loss by taking either choice, namely, (a) throwing away large numbers of wafers and not re-tuning the production line, or (b) re-tuning the production line and, in cases where the re-tune contains human error, losing productivity because of the human judgment error.

Practices in accordance with the present invention offer win/win alternatives, in other words, those that can help to automatically reclaim what were previously considered out-of-specification dice or wafers without placing production personnel on the horns of a lose/lose dilemma. The present invention can improve final yield while at the same time avoiding the possible errors of human judgment that might come to play with constant, manually-determined fine tunings to processes that affect critical dimensions.

SUMMARY OF INVENTION

Signals representing manufacturing tolerance errors in one or both of gate length ($e_{Gate}$) and sidewall thickness ($e_{Sidewall}$) are fed forward in accordance with the invention to a variable TCI process. The energy and/or dosage values used in the Tilted Channel Implant (TCI) process are automatically adjusted in response. The variability of the energy and/or dosage values provides additional controls which can be automatically fine-tuned in accordance with the invention to counter manufacturing tolerance errors that occur in mass-production defining of gate length and sidewall thickness. Such error feed forward methods may be used in accordance with the invention for improving mass-production statistical distribution of critical parameters in semiconductor devices.

An automated production system in accordance with the invention comprises: (a) a variable TCI process having at least one of variable energy and variable dosage capabilities; and (b) feed-forward means for feeding forward to the variable TCI process, error signals representing manufacturing tolerance errors in one or both of gate length ($e_{Gate}$) and sidewall thickness ($e_{Sidewall}$), wherein at least one of said, variable energy and variable dosage capabilities of the TCI process is adjusted in response to the fed-forward error signals ($e_{Gate}$, $e_{Sidewall}$) to counter the effects of the error.

A mass-production method in accordance with the invention comprises the steps of: (a) defining a target, statistical mean value ($L_{2T}$) for gate length; (b) defining a target, statistical mean value ($S_{wT}$) for thickness of gate sidewalls; (c) measuring error ($L_{2T}-L_{2M}$) in gate length of a production sample; (d) measuring error ($S_{wM}-S_{wT}$) in sidewall thickness of the production sample; (e) calculating an adjusted Tilted Channel Implant energy in response to the measured error in sidewall thickness; (f) calculating an adjusted Tilted Channel Implant dosage in response to the measured error in gate length; and (g) performing a Tilted Channel Implant operation on said production sample while using at least one of the adjusted energy and adjusted dosage during said TCI operation.

A machine-implemented and automated mass-production method in accordance with the invention uses a pre-defined target, statistical mean value ($L_{2T}$) for gate length and a pre-defined target, statistical mean value ($S_{wT}$) for thickness of gate sidewalls, and comprises the steps of: (a) collecting first data representing error ($L_{2T}-L_{2M}$) in gate length of respective production samples; (b) collecting second data representing error ($S_{wM}-S_{wT}$) in sidewall thickness of the production samples; (c) for each non-zero error in sidewall thickness, responsively calculating an adjustment in Tilted Channel Implant energy to be employed for the corresponding production sample; (d) for each non-zero error in gate length, responsively calculating an adjustment in Tilted Channel Implant dosage to be employed for the corresponding production sample; and (e) performing a Tilted Channel Implant operation on each of said production samples while using at least one of the corresponding energy adjustment and corresponding dosage adjustment during said performance of the TCI operation on each respective production sample that is indicated to have non-zero error in gate length or sidewall thickness.

A method in accordance with the invention for optimizing automated, feed-forward compensation for manufacturing tolerance errors in one or both of gate length ($e_{Gate}$) and sidewall thickness ($e_{Sidewall}$) comprises the steps of: (a) defining a target, statistical mean value ($L_{2T}$) for gate length; (b) defining a target, statistical mean value ($S_{wT}$) for thickness of gate sidewalls; (c) determining a target, statistical mean value ($V_{TT}$ or $Q_{TT}$) for a critical electrical characteristic of transistors manufactured to have said target gate length and said target sidewall thickness; (d) identifying first stray production samples that have a predefined first amount of error ($L_{2T}-L_{2M}$) in gate length; (e) experimentally determining an amount of adjustment in Tilted Channel Implant dosage that may be employed for the corresponding first stray production samples so as to bring the critical electrical characteristic of transistors manufactured from said first stray production samples into conformance with said target value ($V_{TT}$ or $Q_{TT}$) for the critical electrical characteristic; (f) defining a dosage adjustment interpolation function for use when second stray production samples are identified with gate length errors substantially close to said predefined first amount of error ($L_{2T}-L_{2M}$) in gate length; (g) identifying third stray production samples that have a predefined second amount of error ($S_{wM}-S_{wT}$) in sidewall thickness; (h) experimentally determining an amount of adjustment in Tilted Channel Implant energy that may be employed for the corresponding third stray production samples so as to bring the critical electrical characteristic of transistors manufactured from said third stray production samples into conformance with said target value ($V_{TT}$ or $Q_{TT}$) for the critical electrical characteristic; (i) defining an energy adjustment interpolation function for use when fourth stray production samples are identified with sidewall thickness errors substantially close to said predefined second amount of error ($S_{wM}$-$S_{wT}$ in sidewall thickness; and (j) using at least one of said dosage and energy adjustment interpolation functions for establishing respective TCI dosage and energy when subjecting further production samples to Tilted Channel Implant.

A method for increasing the mass-production in-conformance range for one or both of a gate trimming process and a sidewall trimming process in accordance with the invention comprises the steps of: (a) defining TCI dosage and energy adjustment functions for use in response to respective detection of error ($L_{2T}$-$L_{2M}$) in gate length of production samples and of error ($S_{wM}$-$S_{wT}$) in sidewall thickness of production samples; and (b) in view of said TCI dosage and energy adjustment functions, expanding the allowed tolerance range that would have been otherwise used if said TCI dosage and energy adjustment functions had not been in place, the expanded tolerance range being at least one for ADICD-defined error in photoresist (PR) trimming, or for FICD-defined error in gate etching, or for measured error in sidewall layer deposition thickness, or for measured error in post-trim sidewall thickness.

Other aspects of the invention will become apparent from the below detailed description.

BRIEF DESCRIPTION OF THE DRAWINGS

The below detailed description makes reference to the accompanying drawings, in which:

FIG. 3 is a combined schematic and further cross sectional view showing the operations of an automated feedforward system in accordance with the invention;

FIG. 4A is a graph for explaining how TCI doping energy may be adjusted to counter error in sidewall thickness, which error can change effective channel length;

DETAILED DESCRIPTION

Figure 1A:
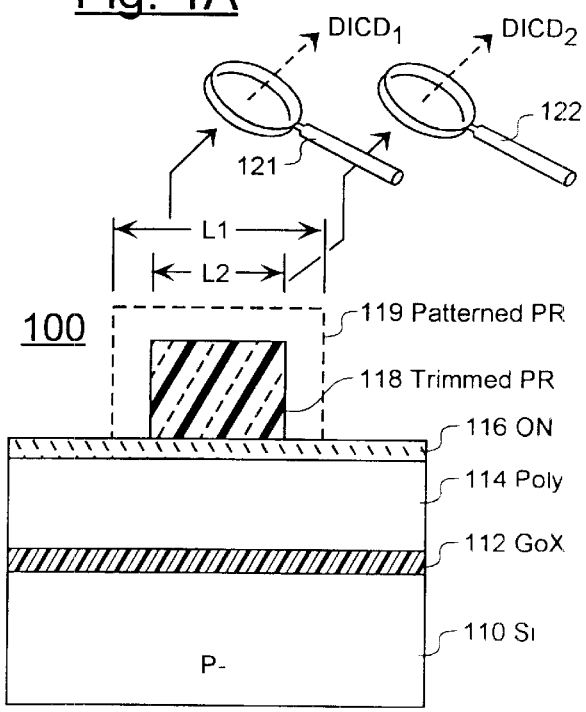
FIG. 1A is a cross sectional view of a first transistor-precursor structure in which photoresist (PR) is isotropically trimmed to below-photolithography dimensions.

FIG. 1A is a cross-sectional view of a first in-process structure 100 (transistor-precursor structure 100) that may occur during mass-production of integrated circuits.

Precursor structure 100 may be arrived at as follows. A lightly-doped (e.g., P−) semiconductor substrate 110 such as one formed of monocrystalline silicon or another suitable material is provided. A thin layer of gate-insulating oxide (GoX) or of another suitable material is thermally grown or otherwise formed on the substrate 110. A gate-forming material such as polycrystalline silicon or another suitable material is deposited by CVD process or by other means to define a gate-precursor layer 114 (e.g., poly-1) on top of the GoX layer 112. An anti-reflective coating (ARC) such as made of an oxynitride (ON) material 116 may be provided on the gate layer 114. Photoresist (PR) is deposited on the resulting precursor structure. Photo-lithographically or like feature-defining methods are used to pattern and develop PR features such as 119 to have initial dimensions such as the illustrated first length, L1.

Because of limitations in photolithographic or other feature-defining processes, there is typically a constraint on how small the first dimension L1 may be. For example, in one process the desired or target value for L1 may be limited to being no smaller than about 200 nanometers (0.200μ). A first metrology step 121 may be carried out to measure the actual L1 dimension of plural production samples and to produce a corresponding $DICD_1$ or $ADICD_1$ (After-Development Inspection of Critical Dimension) measurement value.

Isotropic etching of selected ones or all of the patterned PR layer features is typically employed to trim the anisotropically-etched photoresist 119 to sub-lithography dimensions. In FIG. 1A, the originally patterned photoresist is shown as dashed outline 119 with the corresponding first length dimension, L1, while the post-trim photoresist is shown as hatched block 118 with a corresponding second length dimension, $L_2$ (where L2<L1). In one exemplary process the desired or target value for L2 may be about 140 nanometers (0.140μ).

A second metrology step 122 may be used to measure the L2 dimension of plural production samples and to produce a corresponding $DICD_2$ or $ADICD_2$ measurement value. One or the other of metrology steps 121 and 122 may be bypassed if desired, or both may be carried out.

Figure 2:
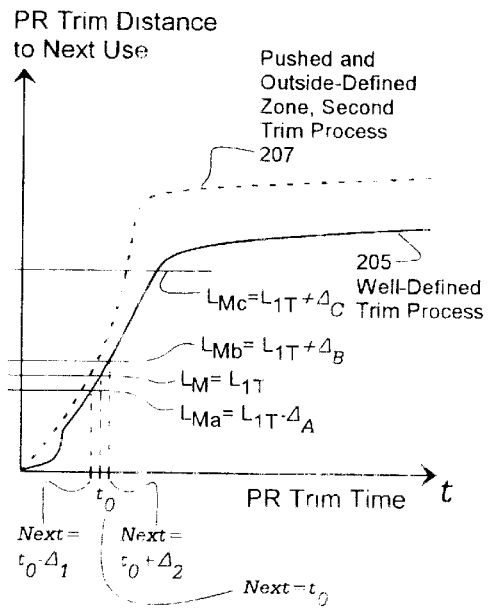
FIG. 2 is a graph illustrating how fine-tuning of the PR-trim process can affect critical dimensions.

Referring to FIG. 2, either or both of the pre-trim $DICD_1$ measurement value and the post-trim $DICD_2$ measurement value may be obtained as follows. After the respective formation of the pre-trim, anisotropically-etched photoresist feature 119 or the post-trim, isotropically-etched photoresist feature 118, samples of the dice, wafers or other mass-produced articles in which precursor structure 100 is repeatedly found are sent to a respective metrology station (schematically shown as 121 and 122 respectively) for measurement and determination of the average per-wafer and/or per wafer-lot values of the respective length dimension, L1 or L2, and of its statistical distribution at various points of the wafer (e.g., a 9-point star test) and across the respective production lot. Such measurement and calculation steps provide the corresponding DICD or ADICD measurement values.

If the per-wafer, measured average value, $L_M$ of the pre/post-trim dimension, L1/L2 and its distribution closely match a respective target value, $L_{1T}$ or $L_{2T}$, then the PR trim process is left as is and further batches of wafers are trimmed with the same PR-trim settings.

For each wafer or other sample, there will typically be a manufacturing tolerance error that may be expressed as, $e_{GatePR}=L_{PRT}-ADICD$, where $L_{PRT}$ represents the desired or target value for the developed photoresist (either before or after PR trimming process respectively depending on whether ADICD represents measurement of the L1 or the L2 dimension). The group of fabrication personnel who are responsible for keeping the respective pre-trim or post-trim PR length (ADICD) close to the established ideal or target value ($L_{1T}$ or $L_{2T}$), will typically define an allowed tolerance-range, $e_1' \leq e_{GatePR} \leq e_2'$ (where $e_1'$ is typically less than zero while $e_2'$ is greater than zero). Nonconforming, post-trim wafers may have to be thrown away. In the above, exemplary process where L2 is about 0.140 μm, $e_1'$ may be −0.015 μm for example while $e_2'$ may be +0.010 μm.

During mass-production, a situation may arise (as already alluded to above) where relatively large numbers of wafers begin to slip outside the predefined, allowed tolerance-range, $e_1' \leq e_{GatePR} \leq e_2'$. In other words, the measured critical dimension values begin to slip away from closely matching the target, $L_{1T}$ or $L_{2T}$, value. This could indicate that some parameter of the PR-development process might be slipping and that it may be desirable to fine-tune the PR-trimming process in order to compensate for the slippage. On the other hand, it could be a random statistical coincidence.

The safest parameter to play with (if any process parameter is to be tuned at all) is the isotropic etch time which converts pre-trim feature 119 into post-trim feature 118. FIG. 2 illustrates a plot of trim-distance (etch depth) versus trim-time for a well-defined (well-characterized), first trim process 205. Under normal circumstances, with the PR etch time set at the nominal value, say $t_0$, the average $ADICD_1$ measurement of the pre-trim PR features 119 should come back with a measured feature length of $L_M$ being very close or equal to the target length, $L_{1T}$ (that is, $L_M=L_{1T}$). The corresponding, next PR trim ,time that will be used to convert a next, on-target, pre-trim feature 119 to an on-target, post-trim feature 118 having target length, $L_{2T}$ will be the same PR trim time of $t_0$ as is indicated in FIG. 2 by the notation, Next=$t_0$.

However, sometimes the measured feature length, $L_{1M}$ of metrology step 121 can be measurably, but not substantially, below the targeted etch length, $L_{1T}$, such as indicated in the drawing by $L_{Ma}=L_{1T}-\Delta_A$, where $\Delta_A$ is a relatively small, but still out of tolerance, positive perturbation. As one or more wafers begin to exhibit the new measured length, $L_{Ma}$, the PR trim process may be predictably fine-tuned by decreasing the PR trim time slightly as indicated on the time line by the notation Next=$t_0-\Delta_1$. PR trim distance should then decrease slightly as predicted by the well-defined, distance versus time curve 205 and this should bring the post-trim feature length, $L_2$ of such wafers back into the allowed tolerance-range, $e_1' \leq e_{GatePR} \leq e_2'$. In other words, after such fine tuning, the average $ADICD_2$ should again be very close to or exactly equal to the target length, $L_{2T}$.

It should be noted in passing that, although the immediately above and below discussions assume that the $ADICD_1$ metrology step (121) is being used to control the PR trim time on a feed-forward basis, it is possible to alternatively or additionally use the $ADICD_2$ metrology step (122) for controlling the PR trim time on a feed-back basis. An advantage of using the described, feed-forward approach (wherein the $ADICD_1$ metrology step, 121 controls PR trim time of same product) is that over-etched product (samples where L1 is below target) do not have to be discarded. In counter to this, an advantage of using the feed-back approach (wherein the $ADICD_2$ metrology step, 122 controls the PR trim time for subsequent product) is that a tighter control over dimensions may be obtained because actual results, after PR trim, are being measured instead of relying on pre-trim measurements. The feedforward control system (which relies on 121 for controlling PR trim time) is an open-loop and thus predictive approach. However, a disadvantage of using the feed-back approach (where $ADICD_2$ controls PR trim time), at least in conventional processes, is that over-trimmed product (samples where L2 is below target value $L_{2T}$) have to be discarded because one cannot un-do an excessive trim. One can only further trim, a still-undertrimmed feature. The present invention contemplates using either approach or a combination of both.

Continuing with the explanation of FIG. 2, if the measured feature length, $L_M$ of a significant number of wafers begins to slip towards a new mean that is above the allowed tolerance-range, $e_1' \leq e_{GatePR} \leq e_2'$, but not substantially above the target length, such as indicated by $L_{Mb}=L_{1T}+\Delta_B$, where $\Delta_B$ is a relatively small and positive perturbation, then the ensuing PR trim time may be automatically fine-tuned as indicated on the time line by Next=$t_0+\Delta_2$, where $\Delta_2$ is positive. After such fine tuning, the post-trim, $ADICD_2$ value (L2) should return to being again very close to or exactly equal to the target post-trim length, $L_{2T}$.

Let's say, however, that at some point in time the measured, pre-trim length values, $L_M$ start coming in as being drastically larger than the target length, such as indicated by $L_{Mc}=L_{1T}+\Delta_C$, where $\Delta_C$ is a relatively much larger, positive deviation than are each of the fine-tunable deviations represented by $\Delta_A$ and $\Delta_B$. In such a case, curve 205 may no longer provide an accurate prediction for what results are to be expected under the current state of the PR trimming equipment. If PR trim time is changed dramatically, the process can become highly nonlinear. In other words, if users begin to push the process outside the linearly predictive part of curve 205, the actual results may not conform with what the curve 205 predicts. There may be no well-defined amount of increase in trim time (e.g., Next=$t_0+\Delta_3$; not shown) that can assuredly return production results back to the desired, mean target value, $L_{2T}$ when the $L_{Mc}=L_{1T}+\Delta_C$ situation is encountered. Alternatively, the curve-dictated increase in trim time (e.g., Next=$t_0+\Delta_3$) may be too large to be acceptable for meeting production schedules.

Process technicians may elect in such a situation to switch to a different PR trim process such as second process 207. However, the second trim process 207 may be one that has not been well characterized. Its results may therefore not be accurately predictable. This may throw automated control out of a stable region of operation. Also, if the new process 207 is a more energetic one than the better-defined, process 205, fabrication uniformity may change drastically by shifting to the more energetic process 207. Nonetheless, this is something that is sometimes done in order to meet production schedules.

Human technicians may well make correct, non-automated decisions in the short run. However, experience shows that over the long haul, process technicians will eventually make a human judgment error and choose a wrong one of a set of poorly-defined trim processes such as 207. Yields may then suffer drastically and thereby bring about an outcome that is the exact opposite of what the technicians wanted, namely to minimize process error.

There is need for a better approach. Preferably this better approach is one that is automated so that human judgment error does not participate as a controlling factor.

Figure 1B:
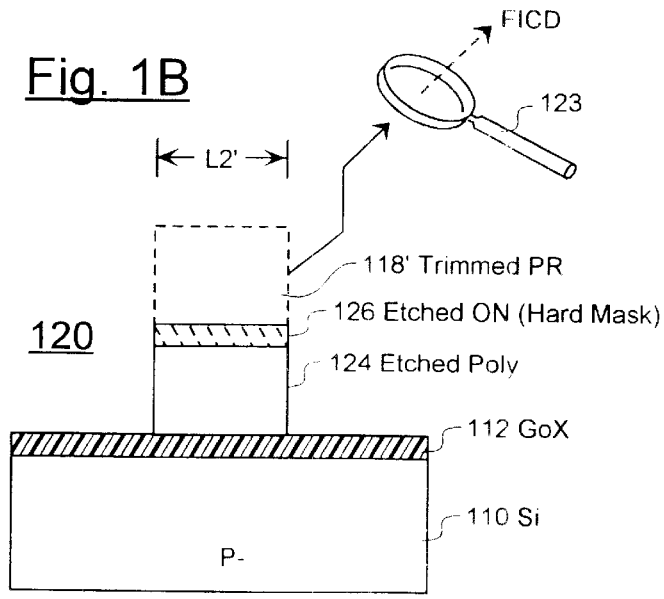
FIG. 1B is a cross sectional view of a second transistor-precursor structure in which a gate substructure is formed by anisotropic etching.

The above discussions concerning the tuning of PR trim time in response to ADICD measurements is just an introduction to a problem of bigger scope. That scope will be expanded on, shortly. However, before we continue along that path, it is worthwhile to understand the remainder of a transistor-forming process that conforms with the present invention. FIG. 1B shows a cross-sectional view of a subsequent, transistor-precursor structure 120 that is derived from structure 100 (FIG. 1A). In the time frame of FIG. 1B, the trimmed PR block 118 has been used as an initial mask for etching ARC layer 116 to thereby define a hard mask region 126. Subsequent anisotropic etching has produced the post-etch, polysilicon gate structure 124, as shown. This gate structure 124 has a length L2' which should be equal to or relatively close to a corresponding and pre-defined, post-etch target length $L_{2'T}$ if the anisotropic etch has proceeded in a predicted manner. One way that the L2' dimension can be made to statistically track the pre-defined, target length $L_{2'T}$ is by using the PR trim tuning method shown in FIG. 2 and by throwing away those nonconforming wafers that cannot be corrected with just the use of PR trim tuning. In other words, we discard those of the pre-trim or post-trim wafers whose respective $ADICD_1$ or $ADICD_2$ error is outside the fine-tunable range, $e_1' \leq e_{GatePR} \leq e_2'$.

Similar to the way that samples of the first transistor-precursor structure 100 were sent to the first and/or second metrology stations (121 and 122 respectively); and similar to the way that nonconforming, unreworkable wafers were discarded; samples of the second transistor-precursor structure 120 are typically sent to a third metrology station 123. This third metrology station 123 may be dedicated to optically measuring the L2' dimension of gate sub-structure 124. A determination is made of the average per-wafer and/or per wafer-lot values of the post-etch, length dimension, L2' and of its statistical distribution at various points of the post-etch wafers (e.g., a 9-point star test) and across the respective production lot. Such measurement and calculation steps are sometimes referred to as FICD (Final Inspection measurement of Critical Dimension). As with the case of ADICD, an allowed tolerance-range, $e_3 \leq e_{Gate} \leq e_4$ is defined for the FICD results. Nonconforming, post-etch wafers are thrown away. Variations in L2' due to mask undercutting (if there is any) can be compensated for in a manner similar to that explained for FIG. 2. Feedback control from the FICD measurement step 123 can be used to further tweak the PR trim time ($t_{Next'}=t_{Next}\pm\Delta=t_0\pm\Delta_{1/2}\pm\Delta_{3/4}$) of FIG. 2.

Figure 1C:
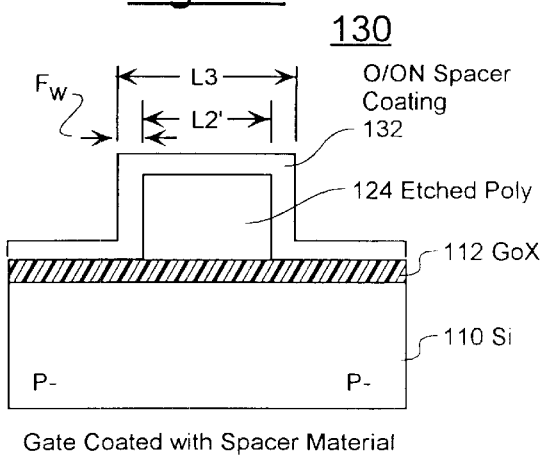
FIG. 1C is a cross sectional view of a third transistor-precursor structure in which a sidewall-forming film is deposited.

FIG. 1C shows a cross-sectional view of a subsequent, third transistor-precursor structure 130 derived from in-process structure 120 (FIG. 1B). Here, a film has been deposited with a film thickness of $F_w$. The film may be composed of a spacer material such as an oxide or an oxynitride and it is typically, conformably deposited as layer 132 over the top and sides of the etched gate structure 124. Deposition thickness, $F_w$, is a controllable variable whose value is predictively set prior to the actual deposition. As with all mass-production operations, the actual deposition thickness may vary from the target thickness on a sample by sample basis. The total lateral length of gate structure 124 plus the sidewall portions of film 132 is denoted as L3.

Figure 1D:
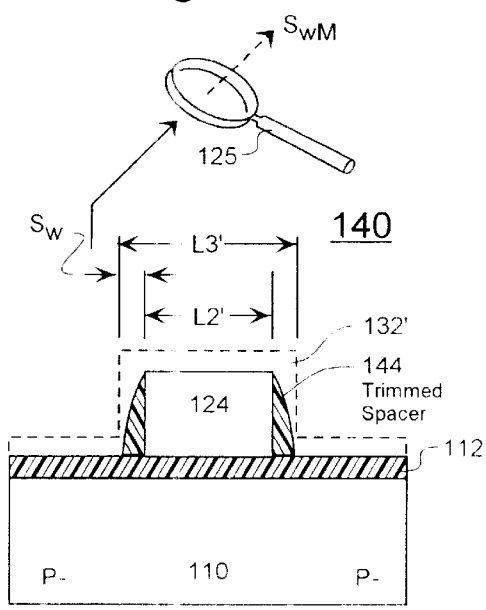
FIG. 1D is a cross sectional view of a fourth transistor-precursor structure in which gate sidewalls are left behind by anisotropic etching and trimmed.

FIG. 1D shows a subsequent, fourth transistor-precursor structure (product-in-process form) 140 derived from in-process structure 130. Here, the initial spacer material film 132 has been anisotropically etched-down to remove its laterally-extending portions. The vertically-extending portions of the spacer material remain and thereby define, a set of trimmed spacer sidewalls 144 along the sides of gate sub-structure 124. The overall length of gate 124 and the trimmed spacers 144 is denoted as L3'. The post-trim width of each of the sidewall spacers is denoted as $S_w$. The term "trimmed" as applied here to the spacer sidewalls 144 is understood to encompass a fine-tuning adjustment to one or both of the initially-set, deposition thickness, $F_w$ (FIG. 1C) and to the anisotropic etch time (FIG. 1D). Fine-tuning of the spacer sidewall thickness is preferably controlled primarily with fine-tuning of the initial deposition thickness, $F_w$ because this is easier and less costly to control than modifying the anisotropic etch that leaves behind the spacer sidewalls 144. However, it is within the contemplation of the present invention use either one or a combination of both the initial deposition thickness ($F_w$) and the side-wall trim as process variables that may be fine-tuned.

After the spacer formation and trimming process is completed, samples of the fourth transistor-precursor structure 140 are sent to a fourth metrology station 125. This fourth metrology station 125 may be dedicated to optically measuring the thickness dimension, $S_{wM}$ of each of sidewalls 144. A determination is made of the average per-wafer and/or per wafer-lot values of the measured, post-etch, measured sidewall thickness dimension, $S_{wM}$ and of its statistical distribution at various points of the post-etch wafers (e.g., by way of a 9-point star test) and across the respective production lot. As with the case of the ADICD and/or FICD measurements, an allowed mass-production tolerance-range, $e_5 \leq e_{Sidewall} \leq e_6$ is predefined for the $S_{wM}$ results, where $e_{Sidewall}=S_{wM}-S_{wT}$ and $S_{wT}$ is a predefined target value about which the measurements should closely center and $e_5$ is typically less than zero while $e_6$ is greater than zero. Nonconforming, post-etch wafers may be thrown away if over-etched, or returned for further etching (rework) if under-etched. Although the measured sidewall thickness dimension, $S_{wM}$ is preferably defined by measurements taken after deposition layer 132 is trimmed, it is within the contemplation of the invention to define the measured sidewall thickness dimension, $S_{wM}$ as being determined instead by measuring the pre-trim thickness $F_w$ of deposition layer 132 or as being determined by combining pre-trim and post trim measurements for the sidewalls 144 as may be appropriate.

Variations over time in the returned values of $S_{wM}$ due to process slip (if there is any) can be compensated for in a manner similar to that explained for FIG. 2, but this time, preferably using the initial deposition thickness, $F_w$ as a feedback, tuning control. Alternatively, or additionally, the post deposition trim time for the sidewalls may be tuned.

Figure 1E:
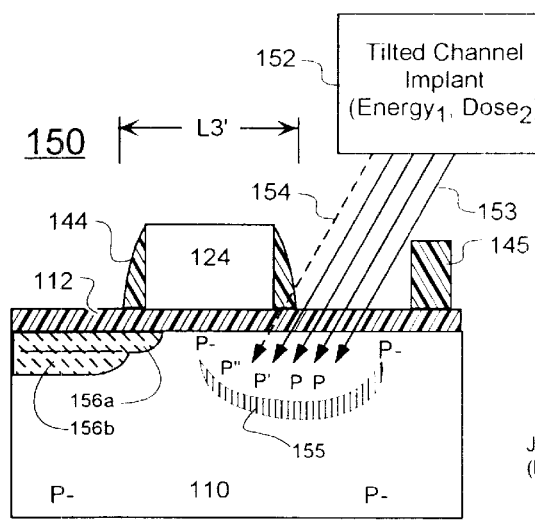
FIG. 1E is a cross sectional view of a fifth transistor-precursor structure in which a channel doping gradient is defined by TCI doping.

FIG. 1E shows a next state 150 of the in-process structure wherein Tilted Channel Implant (TCI) is performed to thereby define a gradient (P, P',P") of channel doping density within regions where source and drain regions will abut into transistor channel regions. The PN junctions that will form between the channel and the source/drain regions, will be defined later. The characteristics of these PN junctions (including depth and lateral position) will be determined in part by the locus of the TCI-created, channel doping. More specifically, after thermal diffusion, there will be points inside the substrate where the TCI-created, density of P dopants balances equally against the source/drain doping density of implanted N dopants. In other words the points that satisfy N=P in terms of doping density will define the neutral center of the PN junction as shown at 157 in FIG. 1F).

The Tilted Channel Implant (TCI) may be carried out by aiming implant beams at a tilted angle towards the combined gate structure 124 and trimmed sidewall spacers 144. The TCI process may also be masked by an added, photoresist mask 145. FIG. 1E shows a TCI doping source 152 applying tilted ion beams such as 153 and 154 to the structure. It is understood that the TCI implant operation will usually rotate either in steps or uniformly about the Z axis (vertical axis). In one embodiment, the rotations are in equal steps of between 45 degrees to 90 degrees thereby respectively providing between 8 to 4 equal rotations. The uniform or stepped rotations provide a generally uniform distribution of dopants in areas that are not shaded by features such as gate 124 and its sidewalls 144 (or mask 145). It is known in the art that a so-called 'halo effect' will develop in the shaded regions of the gate 124 and sidewalls 144. At a relatively large lateral distance out and away from the center of the spacer/gate/spacer structure 144/124/144, the dopant implant concentration will be relatively large (P) due to symmetrical contribution by unshaded beams such as 153 from all angles. At relatively smaller lateral distances from the center of structure 144/124/144, the implant concentration will be relatively moderate (P') due to some shadowing effect being provided by the upwardly projecting, gate/sidewalls structure 124/144. At yet a smaller lateral distance, the ion doping contribution will be relatively even smaller (P") and shallower because the only ion beams that manage to get to such under-the-gate locations are those tilted beams such as 154 which pass through a lower portion of sidewall 144. Sidewall 144 behaves as sort of a soft sponge that absorbs some of the ions and reduces the energy, and thus reduces the density and the depth of penetration of those ions (P") that get through.

As for the channel doping that will develop under the center of gate/sidewalls structure 144/124/144, the gate structure 124 may act as a hard mask that blocks substantially all or part of the TCI doping beams 153–154 from getting through to the underlying, middle part of the channel region. Such a partial or full shading effect may leave the central part of the channel with essentially only the initial, P– density that was present in the initial substrate. (Of course, doping superposition variations on this basic approach are within the contemplation of the invention.)

From the above it is seen that a halo-effect doping gradient may be produced in the channel. Under the very center of the gate/sidewalls structure 144/124/144, the ion doping contribution by the TCI operation will be essentially absent and the roughly middle part of the channel will thus retain the initial P– concentration that it had before the TCI operation (or a superposition of such with other doping processes). In one embodiment, the initial, P– density is about 1E15 (or $10^{15}$) doping atoms per $cm^3$ while the heavier P density that is provided by the TCI operation is about $1E18/cm^3$. The heavier P density tapers down through successive intermediate levels, P' and P" down to the lower P– density as one moves laterally from outside and toward the center of the shadow cast by the spacer/gate/spacer structure 144/124/144. This halo-distributed, channel doping gradient is represented schematically at 155 in FIG. 1E.

N-type dopants for forming the source/drain regions may be implanted before and/or after the Tilted Channel Implant 153/154. In one embodiment, a shallow, first N implant is performed before sidewalls 144 are formed to thereby define a shallow, inner part 156a of the source/drain regions 156/156'. In the same embodiment, a deeper, second N implant is performed after sidewalls 144 are formed to thereby define a deeper, outer part 156b of the source/drain regions. Typically, the gate structure 124 will acquire a heavy N+ doping from the ions it intercepts during the source/drain dopant implants. The top of the gate structure 124 may be masked (not shown) during the TCI operation.

Figure 1F:
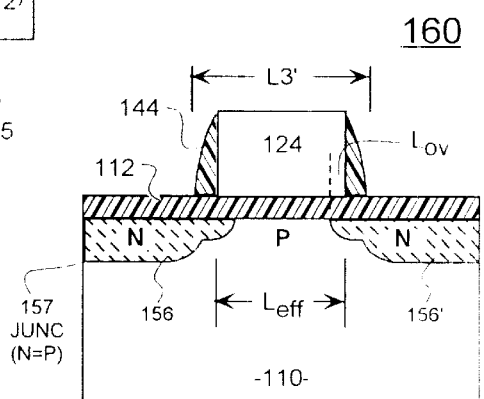
FIG. 1F is a further cross sectional view of the fifth transistor-precursor structure for showing more clearly how critical transistor parameters, $L_{eff}$ and $L_{OV}$ can be defined by source and drain implant steps and by preceding process steps.

A schematic of the resulting source and/or drain profiles is shown at 156 and 156' of FIG. 1F. The PN junction 157 that outlines the profile is understood to be the locus of points in which P-type doping balances out with N-type doping. The locations of such P=N balance points can be shifted inwardly (towards the center of spacer/gate/spacer structure 144/124/144) or outwardly depending on how the P"P'P gradient 155 is shaped and located and depending on how the N-type source/drain implants are carried out and how all dopants are diffused by thermal process.

The illustrated source and drain regions 156 and 156' in FIG. 1F provide an effective channel length, $L_{eff}$ therebetween. The dimension of this effective channel length, $L_{eff}$ is a function of both the TCI process and the N-type source/drain implants and a subsequent thermal annealing process that diffuses the implanted ions according to predefined diffusion characteristics.

There may be a slight overlap $L_{OV}$ between the outer vertical walls of the gate 124 and the ends of the source and drain regions. This overlap defines an undesirable parasitic capacitance known as $C_{OV}$. During rapid switching of gate-to-source voltage, $V_{GS}$, the parasitic capacitance, $C_{OV}$ needs to be charged or discharged in order to bring the effective gate-to-source voltage above or below the transistor's threshold level, $V_T$. In general, large values for the parasitic capacitance, $C_{OV}$ are undesirable because they tend to slow down switching speed and/or increase power consumption.

In summary, it is seen from the illustrated sequential process steps of FIGS. 1A–1E how certain critical dimensions such as, $L_2'+S_w=L3'$, may determine the ultimate effective length $L_{eff}$ of the transistor. It is understood in the art that $L_{eff}$ is critical to defining many parameters of transistor behavior including switching speed and the transistor's threshold voltage, $V_T$. The profile and doping concentration gradients in regions 155 and 156a/b are also responsible for defining threshold voltage $V_T$. The total amount of charge that may be stored in the surface region of the channel is determined by the net density of P-type doping atoms provided in this region and by the surface-length limiting effects of the source and drain regions 156/156' which have a countering amount of net N-type doping atoms provided therein.

FIG. 3 shows an automated fabrication system 300 in accordance with the invention. Fabrication system 300 includes one or more data collecting computers 301 that collect and thereafter optionally transform (via computational steps) process-related data, including metrology data that defines measured values, $L_{2M}$ and $S_{wM}$ or corresponding other measured values relating to gate length and sidewall thickness.

Fabrication system 300 further includes one or more process flow control computers 302 that track in-process wafers and define the targeted process dimensions or other attributes that are to be imparted to the wafers during different parts of the fabrication flow sequence. The process flow control computer(s) 302 therefore generally define the target values, $L_{2T}$ and $S_{wT}$ or corresponding other target values relating to gate length and sidewall thickness.

Fabrication system 300 yet further includes one or more implant control computers 303 that communicate with one or both of the process flow control computer(s) 302 and the data collecting/processing computer(s) 301. Computer(s)

301 and 302 are usually interlinked with one another as well as with implant control computer(s) 303 by way of a communications network.

A fabrication control process 360, that will be shortly described, may be implemented by way of software and/or hardware either fully in one, or distributively among, computers 301, 302 and 303. It is within the contemplation of the invention to use general-purpose, and/or special-purpose computers that are re-configured or programmed with appropriate software to perform the herein-described functions. The re-configuring or programming of the computer(s) may be carried with use of one or both of computer-readable media (e.g., a CD-ROM or floppy diskette) 305 and network-downloaded signals 306, where the media 305 and/or signals 306 convey software instructions to respectively targeted computing machines for causing any one or more of such computer(s) 301–303 to become configured or programmed to perform part or all of the TCI feedforward control operations (360) described herein.

As shown, fabrication system 300 comprises a variable TCI beam source 352 that is operatively and automatically controlled by implant control computer(s) 303. The variable TCI beam source 352 has at least one, and preferably both of variable energy and variable dosage capabilities. The variable energy and dosage controls of source 352 are denoted as Energy$_a$ and Dose$_b$ and these are controllable by implant control computer(s) 303. Signals 362 and 364 that respectively represent manufacturing tolerance errors in gate length (e$_{Gate}$) and sidewall thickness (e$_{Sw}$) are fed forward from their respective calculating means (361, 363) to the TCI control computer(s) 303. In one embodiment, e$_{Gate}$ is defined as target length L$_{2T}$ (which could be either the PR trim target length or the post-etch gate target length or a combination of both) minus the measured PR length L$_{2M}$ (which could be either DICD or FICD or a combination of both). In the same or an alternate embodiment, e$_{Sw}$ is defined as measured sidewall thickness S$_{wM}$ minus target thickness S$_{wT}$. The measured values can be directly measured ones or values that are derived as statistically fair representatives of what is happening in their respective PR-trimming, gate-etching or sidewall film-deposition or sidewall etching/trimming processes.

The energy and/or dosage values used in the TCI process (352) are manually or automatically adjusted for each respective product in response to the received one or both of error signals 362 (e$_{Gate}$) and 364 (e$_{Sw}$). The preferred modality is for automatic (machine-implemented) adjustment because that removes the possibility of human error from the process. The energy and/or dosage values provide additional controllable variables which can be automatically tuned in accordance with the invention to counter manufacturing tolerance errors as will be explained shortly. Such feed forward means may be used in accordance with the invention for improving mass-production statistical distribution of critical parameters in semiconductor devices.

Consider first the case where error signals 362 (e$_{Gate}$) and 364 (e$_{Sw}$) are both zero. For this case, there will be a specific and predefined set of default values (experimentally pre-established) for controllable variables, Energy$_a$ and Dose$_b$ of source 352 as are to be applied for a respective product (e.g., a microprocessor chip or a memory chip). Let us call these, E$_0$ and D$_0$ respectively. Source/drain region 356 will have a corresponding, first doping distribution profile as represented by first junction outline 356$a$. It is understood that repeated electrical testing of final product statistics in the mass-production line has been performed beforehand to demonstrate that the default energy and dosage values, E$_0$ and D$_0$ are the essentially optimal ones for the given product in the case where the measured ADICD, FICD and sidewall thickness values are essentially on target.

Consider next the case where error signal 364 (e$_{Sw}$) is positive while signal 362 (e$_{Gate}$) is zero. That implies that the measured sidewall thickness S$_{wM}$ is greater than the desired (target) thickness. If the TCI doping operation continues to use the default energy and dosage values, E$_0$ and D$_0$, the measurement-detected, excess thickness of the sidewall 144 will effectively pull the P–P'–P" outline 355 laterally outward, away from the center of the gate. Because of this, the outline of doping profile 356 will also shift laterally back from ideal position 356$a$ to a further-back position 356$b$ on each side of the gate. That works to undesirably increase L$_{eff}$.

Suppose, however that we now increase controllable variable Energy$_a$ to a value greater than the default dosage value, E$_0$. The amount of increase can be adjusted to push the P–P'–P" outline 355 deeper into the substrate so the outline 355 essentially returns to its ideal position. As a result, PN junction outline 356$b$ is also pushed deeper into the substrate so the PN junction outline essentially returns to the ideal outline position 356$a$. L$_{eff}$ is then decreased back to its ideal value and mass-production may continue without suffering from the ill effects that the positive sidewall error (364) would have otherwise caused.

In one embodiment, the amount of adjustment of fine tuning to the TCI energy value is automated and given by a linear or quasi-linear interpolation equation of the following form:

$$\text{Energy}_a = E_0 * (1 + \beta * e_{Sw}/S_{wT}) \quad \{\text{Eq. 2}\}.$$

In the above equation, Eq. 2, the multiplying factor, β may either be a constant or a function of a prespecified windowing range of the normalized error, e$_{Sw}$/S$_{wT}$. In one embodiment, where P-channel devices (PNP FET's) are being fabricated, the multiplying factor, β is defined as one or more constant values selected from the range, $0.02 \leq \beta \leq 0.20$ where the selected value or values may depend on the sign and/or magnitude of e$_{Sw}$/S$_{wT}$. In a second embodiment, where again P-channel devices are being fabricated, the multiplying factor, β is defined as one or more values selected from the range, $0.05 \leq \beta \leq 0.15$ where the selected value depends on the sign of e$_{Sw}$/S$_{wT}$.

The multiplying factor, β may be derived from an empirical experience curve 450 such as shown in FIG. 4A which has one, two, or more empirically-obtained prediction points (e.g., E$_H$, E$_L$). Tests may be conducted to discover at least one, higher level of implant energy, E$_H$ which is statistically significant and useful for bringing electrical characteristics of manufactured devices back to the targeted characteristics in cases where the measured side wall thickness, S$_{wM}$ is larger than the desired or target thickness S$_{wT}$ by a given amount. For example, if the targeted thickness for the side walls is 400 Å in order to achieve the desired targeted electrical characteristics, a plurality of experiments may reveal that higher implant energy level, E$_H$ is useful for achieving the same electrical characteristics in cases where the side wall thickness is found by measurement to be the higher value of say S$_{wMH}$=600 Å. Such experiments and empirical findings may be carried out for a number of different points on experience curve 450. Then, one or more linear, or other kinds of interpolations may be used for calculating to an appropriately-close level of approximation, the desired higher energy levels for other amounts of positive thickness error, e$_{Sw}$. Straight line 451 in the magnified explosion, for example, shows how one such linear interpolation may be carried out for errors that lie between the experimentally-validated values for energy levels in the windowing range of $E_0$ to $E_H$ or above.

Returning to FIG. 3, suppose now that the sidewall error signal, $e_{Sw}$ (364) is negative, thereby indicating that the measured sidewall thickness is less than the target or desired sidewall thickness. If this is so, the nominal implant energy $E_0$ will be too high and will push the TCI doping implant P–P'–P" 355 too deep into the substrate. As a consequence, the resulting PN junction profile 356c will be too deep. The solution, in accordance with the invention, is to reduce the implant energy level to a lower value such as, $E_L$. Again, the experience curve 450 is used to validate with empirical measurements what one or more values of lower implant energy such as $E_L$ reproduce the electrical characteristics that are also found in devices whose sidewall thickness is at the nominal or targeted value of $S_{wT}$. Straight line 452 in the magnification explosion shows how linear interpolation may be used to calculate a substantially close approximation of the correction values for the implant energy in cases where the error is other than those which are validated with corresponding experiments. Note that different slopes can appear for the linear interpolation lines, 451 and 452 that extend from the ideal or default point, ($E_0$, $S_{wT}$) Accordingly, the sign of the $e_{Sw}$ error signal (364) may be used as a windowing parameter to determine which of interpolation lines, 451 and 452 is to be used. Other windowing determinants may be used additionally or alternatively as various situations may dictate. The multiplying factor, $\beta$ of Eq. 2 may therefore be kept as a positive value whose magnitude changes in response to the sign of the $e_{Sw}$ error signal. The sign of the $e_{Sw}$ error signal determines automatically whether the TCI implant energy, $E_a$ is to be increased or decreased in accordance with one embodiment of the above explanation.

Referring again to FIG. 3, consider now a case where the measured gate length $L_{2M}$ is smaller than the desired or targeted length $L_{2T}$ even though the sidewall thickness is on target ($e_{Sw}=0$). The depth of the TCI process will be accurate relative to the sidewall edges of the gate 124. However, the effective gate length, $L_{eff}$ of the transistor will be too short. To counter this effect, the dosage $Dose_b$ of the Tilted Channel Implant should be increased to thereby effectively push the location of the P–P'–P" outline 355 laterally out and away from the center of the gate 124. The effect of this will be to also push the P=N junction 356a laterally outward so that the desired effective gate length, $L_{eff}$ is realized even though the gate dimension, $L_{2M}$ was below target ($L_{2M}<L_{2T}$).

In one embodiment, the following, interpolating correction formula (Eq. 3) is used:

$$Dose_a = Dose_0 *(1+\alpha(L_{2T}-L_{2M})/L_{2T}) \qquad \{Eq.\ 3\}$$

Multiplying factor $\alpha$ is positive and causes the actual TCI dosage to increase above ideal value, $Dose_0$ if $L_{2M}$ is found to be below target ($L_{2M}<L_{2T}$). On the other hand, if $L_{2M}$ is found to be above its target value ($L_{2M}>L_{2T}$), then the action of a control mechanism acting according Eq. 3 will be to decrease the actual TCI dosage to a value less than the ideal value, $Dose_0$. This will work to pull the P=N junction 356a laterally inward so that the desired effective gate length, $L_{eff}$ is realized even though the gate dimension, $L_{2M}$ was above target ($L_{2M}>L_{2T}$).

In one embodiment, where P-channel devices (PNP FET's) are being fabricated, the Eq. 3 multiplying factor, $\alpha$ is defined as one or more constant values selected from the range, $0.05 \leq \alpha \leq 0.15$ where the selected value or values may depend on the sign and/or windowed magnitude of $e_{Gate}/L_{2T}$. In a second embodiment, where again P-channel devices are being fabricated, the Eq. 3 multiplying factor, $\alpha$ is defined as one or more values selected about the range of $\alpha$ being approximately 0.10, where the selected value depends on the sign and/or magnitude of $e_{Gate}/L_{2T}$.

Figure 4B:
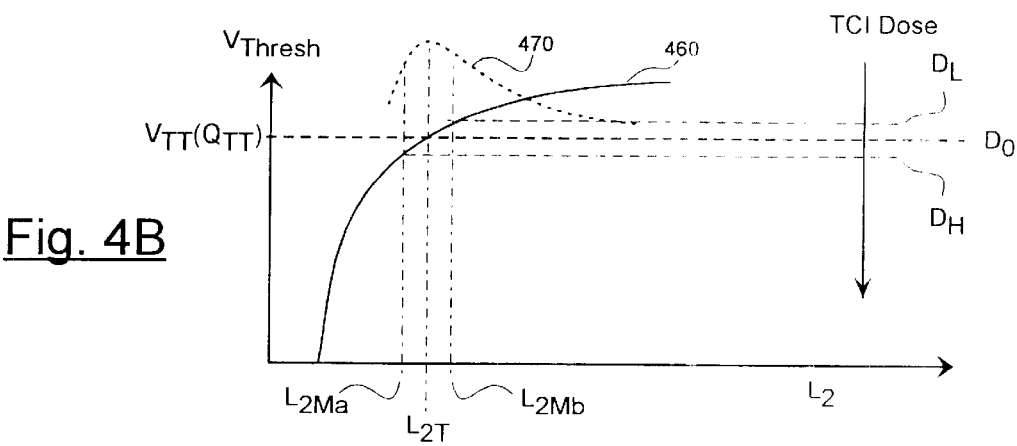
FIG. 4B is a graph for explaining how TCI doping dosage may be adjusted to counter error in gate length, which error can change the effective threshold voltage.

The Eq. 3 multiplying factor, $\alpha$ may be derived from an experience curve 460 such as shown in FIG. 4B. Tests should be conducted to discover what higher or lower level of implant dosage, $Dose_a$ is statistically significant and useful for bringing electrical characteristics of manufactured devices back to the targeted characteristics in cases where the measured gate length dimension, $L_{2M}$ is different from the desired or target length, $L_{2T}$ by a respectively given amount. For example, if the targeted thickness for the gate 124 is $L_{2T}$, a desired or targeted electrical characteristic of the transistor such as threshold voltage, $V_{TT}$ may be predefined, where the latter is associated with a corresponding channel surface charge $Q_{TT}$. A plurality of experiments may reveal that higher implant dose level, $D_H$ is useful for achieving the same electrical characteristics in cases where the gate length, $L_{2Ma}$ is found by measurement to be lower than the targeted length, $L_{2T}$ by a given amount. The comparatively higher TCI dosage, $D_H$ brings the net surface charge in the channel back to target level, $Q_{TT}$ Such experiments and empirical findings may be carried out for a number of different points on experience curve 460. Then, one or more linear interpolations may be used for calculating the desired higher energy levels for other amounts of positive gate length error, $e_{Gate}=L_{2T}-L_{2M}$. Straight lines such as 451 in the magnified explosion of earlier FIG. 4A may be used to provide interpolation for errors that lie between the experimentally-validated values for Dosage levels $D_0$ and $D_H$.

Similarly, if the gate length error, $e_{Gate}=L_{2T}-L_{2M}$ is instead negative, thereby indicating that the measured length is greater than the target length, lower TCI dosage such as $D_L$ may be found by way of experimental validation to be the amount that brings net channel charge (and thus $V_{Thresh}$) to the target value ($Q_{TT}$ or $V_{TT}$ respectively). Again, straight lines such as 452 in the magnified explosion of earlier FIG. 4A may be used to provide interpolation for errors that lie between the experimentally-validated values for Dosage levels $D_0$ and $D_L$.

The characterizing curve for the electrical characteristic that is being controlled (e.g., $V_{Thresh}$) does not have to be monotonically rising such as shown by exemplary curve 460. It may instead be hump-shaped such as shown by exemplary curve 470 or even more complex. The Eq. 3 multiplying factor, $\alpha$ should of course be selected according to the nature of the characterizing curve, 460 or 470 rather than just blindly according to whether the gate length error, $e_{Gate}=L_{2T}-L_{2M}$ is positive or negative. Windowing determinators may be used to select the correct linear, or other interpolating equation for each respective section of an experience curve such as 460 or 470.

Figure 5A:
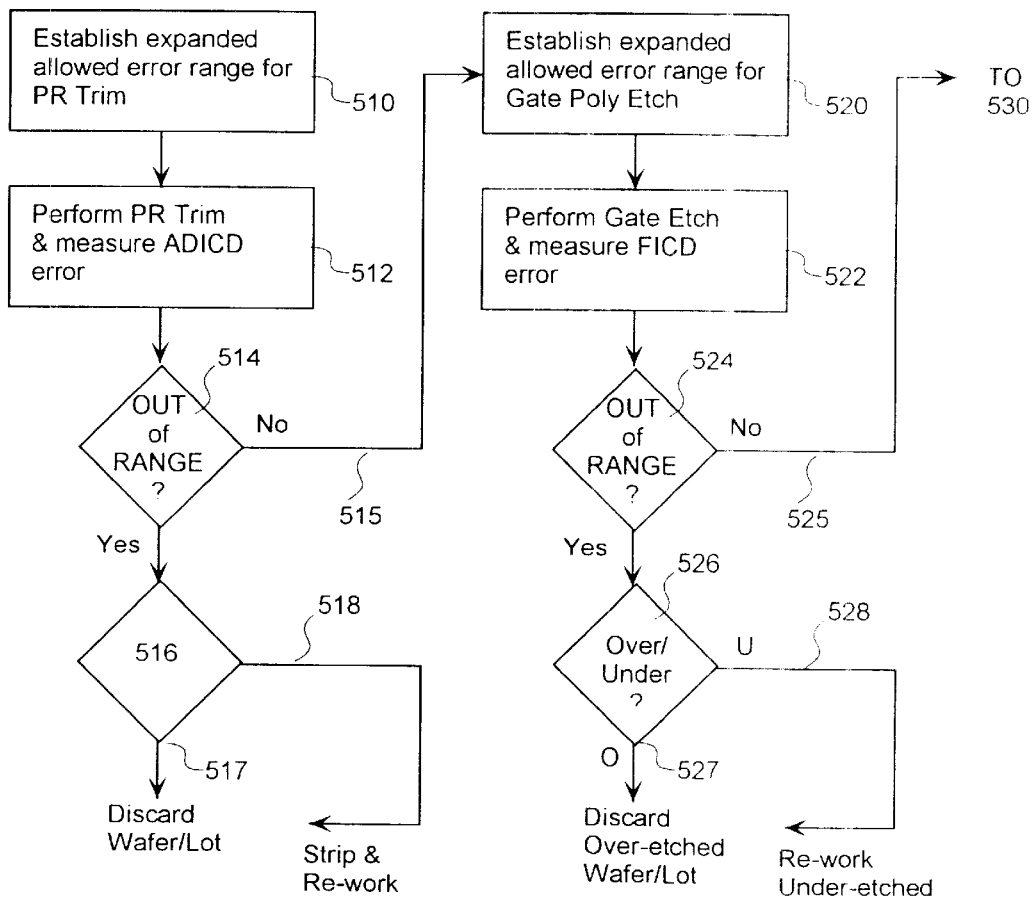
FIGS. 5A and 5B combine to provide a block diagram showing how the in-conformance range of one or both of a gate trimming process and sidewall deposition and/or trimming processes can be widened.
Figure 5B:
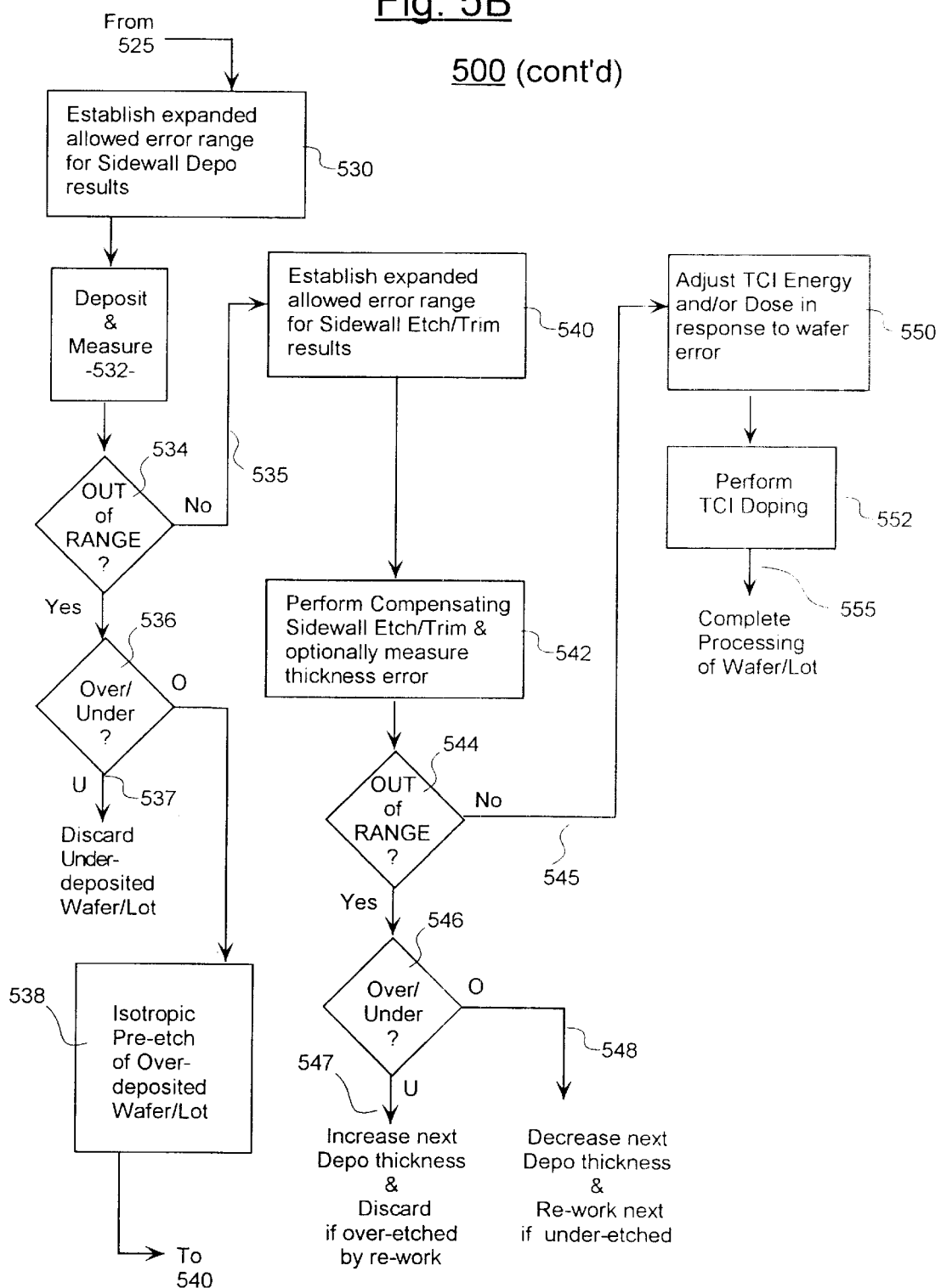

FIGS. 5A–5B provide a process flow chart for a manually and/or machine-implemented process 500 that includes the carrying out of TCI feedforward correction in accordance with the invention. It is presumed that, without the presence of such TCI feedforward correction, that there will be certain, not-yet-expanded and respective, ranges of allowed error for one or more of the PR trim processes (see FIG. 1A), for the gate layer etch (see FIG. 1B), for the sidewall deposition process (see FIG. 1C), and for the sidewall etch/trim processes (see FIG. 1D). Embodiments in accordance with the invention do not necessarily carry out all of the steps or expansions of respective, ranges of allowed error as described in the following. It is illustrated by way of respective operations 510, 520, 530 and 540, that respective tolerable errors can be expanded somewhat for one or more of the PR trim processes (steps 512–514), for the gate layer etch processes (steps 522–524), for the sidewall deposition process (steps 532–534), and for the sidewall etch/trim processes (steps 542–544) because of the counter compensating adjustments that are made to TCI energy and/or dosage in the more downstream step 552. The respective expansions of tolerable error range for each of the out-of-range error tests in FIGS. 5A–5B, namely for tests 514, 524, 534 and 544, can mean that more wafers pass each such test and ultimate yield increases as compared to a like process that does not have feedforward compensation in the TCI step. It is therefore the feedforward compensation in TCI adjustment step 550 that allows the expansion of the error ranges and the increased yield of within-specification devices.

More specifically, in the first and optional, error range expansion step 510, a comparatively expanded error range, $e_1'' \leq e_{GatePR} \leq e_2''$ is established where $e_1'' < e_1'$ and/or $e_2'' > e_2'$ and where $e_1'$ and $e_2'$ are the error limits used (typically the first one being negative and the second positive) if TCI feedforward adjustment step 550 is bypassed. Next, in step 512, the photoresist (PR) patterning and trimming processes are performed and a corresponding $DICD_1$ and/or $DICD_2$ measurement is taken. See FIG. 1A.

In test step 514, it is determined whether one or more of the ADICD errors is outside of its respective and allowed tolerance range. If the answer is YES, then the out-of-range wafer (or lot of wafers) may be discarded as indicated by step 517. Optional decision step 516 can be carried out for cases where it is economically and technically feasible to strip the out-of-specification PR layer (118 or 119) and form a new one in its place. In step 516, the reason for the out-of-range result of step 514 is analyzed and a decision is made whether to re-tune the PR patterning and/or trimming process and to thereafter or nonetheless strip and rework the nonconforming wafers.

Path 515 is taken by wafers that are found to be in-range by test 514. In optional, error range expansion step 520, a comparatively expanded, second error range, $e_3'' \leq e_{GateEtched(Poly)} \leq e_4''$ is established for gate layer etching, where $e_3'' < e_3'$ and/or $e_4'' > e_4'$ and where $e_3'$ and $e_4'$ are the error limits used (typically the first one being negative and the second positive) if TCI feedforward adjustment step 550 is bypassed. Next, in step 522, the gate layer etching processes are performed and a corresponding FICD measurement is taken. See FIG. 1B.

In test step 524, it is determined whether one or more of the FICD errors is outside of its respective and allowed tolerance range. If the answer is YES, then the out-of-range wafer (or lot of wafers) may be discarded as indicated by step 527. Optional decision step 526 can be carried out for cases where it is economically and technically feasible to further etch wafers whose gate layer is not yet etched far enough (under-etched). In step 526, the reason for the out-of-range result of step 514 is analyzed and a decision is made whether to re-tune the PR patterning and/or trimming process and to thereafter or nonetheless further etch (528) those wafers or dice whose gate layer is under-etched. (It is generally not feasible or economical to strip and rework nonconforming wafers whose gate layer is over-etched such that gate length is too short.)

Path 525 is taken by wafers that are found to be in-range by test 524. In optional, error range expansion step 530, a comparatively expanded, third error range, $e_5'' \leq e_{Depo} \leq e_6''$ is established for sidewall layer deposition, where $e_5'' < e_5'$ and/or $e_6'' > e_6'$ and where $e_5'$ and $e_6'$ are the error limits used (typically the first one being negative and the second positive) if TCI feedforward adjustment step 550 is bypassed. Next, in step 532, the depositing of the sidewall layer (132) is carried out and a corresponding deposition thickness measurement is taken. See FIG. 1C.

In test step 534, it is determined whether one or more of the deposition thickness errors is outside of its respective and allowed tolerance range. If the answer is YES, then the out-of-range wafer (or lot of wafers) may be discarded as indicated by step 537. Optional decision step 536 can be carried out for cases where it is economically and technically feasible to further etch wafers whose sidewall deposition thickness is too large for correction simply with the sidewall etch/trim process 542. In step 536, the reason for the out-of-range result of step 534 is analyzed and a decision is made whether to re-tune the sidewall material deposition process and to thereafter or nonetheless further etch (538) those wafers whose sidewall layer 132 is too thick. (It is generally not feasible or economical to strip and rework nonconforming wafers whose sidewall deposition layer is too thin for counter compensation in the subsequent, sidewall etch/trim process 542.)

Path 535 is taken by wafers that are found to be in-range by test 534. Additional wafers may reach next step 540 or 542 after being corrected in step 538. In optional, error range expansion step 540, a comparatively expanded, fourth error range, $e_7'' \leq e_{SW\_trim} \leq e_8''$ is established for sidewall etching and trimming, where $e_7'' < e_7'$ and/or $e_8'' > e_8'$ and where $e_7'$ and $e_8'$ are the error limits used (typically the first one being negative and the second positive) if TCI feedforward adjustment step 550 is bypassed. Next, in step 542, the anisotropic etching and/or subsequent isotropic trimming of the sidewall spacers (144) is carried out and a corresponding sidewall thickness measurement ($S_{wM}$) is taken. See FIG. 1D. The trimming of the sidewall spacers (144) compensates partially for error in the sidewall deposition thickness.

In test step 544, it is determined whether one or more of the sidewall thickness errors is outside of its respective and allowed tolerance range. If the answer is YES, then the out-of-range wafer (or lot of wafers) may be discarded as indicated by step 5437. Optional decision step 546 can be carried out for cases where it is economically and technically feasible to further etch wafers whose sidewall post-trim thickness is too large. In step 546, the reason for the out-of-range result of step 544 is analyzed and a decision is made whether to re-tune the sidewall trim process and to thereafter or nonetheless further etch (548) those wafers whose sidewall thickness is too large. (It is generally not feasible or economical to strip and rework nonconforming wafers whose sidewall spacers are too thin for counter compensation in the subsequent, TCI process 552.)

Path 545 is taken by wafers that are found to be in-range by sidewall thickness test 544. In following step 550, the TCI energy and/or dosage values are adjusted in response to sidewall thickness error (Energy$_a$=f($e_{Sw}$) . . . {Eq. 2a}) and in response to gate length error (Dose$_a$=f($L_{2T}$–$L_{2M}$) . . . {Eq. 3a}) per the above described considerations. In step 552 the TCI doping operation is carried out in accordance with the adjusted energy and/or dosage values of step 550. Continuation flow 555 represents the carrying out of further, downstream processes after the TCI operation 552. Sampled, electrical characterization of devices that are mass-produced by process flow 500 may be carried out as part of the downstream continuation 555.

Table 1 demonstrates computer simulation results for electrical characterization of a given product device that is simulated to be mass-produced by different variations of process flow 500 and assumed to have Gaussian distributions of error in the various critical dimensions discussed above.

TABLE 1

| Electric Param | No APC | Conventional APC | FF TCI Correct using FICD | FF TCI Correct using DICD |
|---|---|---|---|---|
| $I_{on}$ | 0.76 | 0.58 | 0.46 | 0.46 |
| $I_{off\ Leak}$ | 0.50 | 0.39 | 0.38 | 0.37 |
| $C_{OV}$ | 0.51 | 0.69 | 0.38 | 0.38 |

In Table 1, the horizontal rows respectively represent the 3σ mean values for power consumption in terms of transistor conductive-state current, leakage current and overlap capacitance. The vertical columns respectively represent, in left to right order, the statistical results for simulation with no Automatic Process Correction of any kind (sidewall trim or TCI), conventional Automatic Process Correction (no TCI adjust, but yes with respect to sidewall trim), TCI feedforward based on FICD measurements, and TCI feedforward based on DICD measurements. As can be seen, overlap capacitance ($C_{OV}$) is advantageously and significantly reduced by using one of the TCI feedforward correction schemes. This reduction helps to increase device switching speed. Also, power consumption figures in terms of $I_{off\text{-}Leak}$ and $I_{on}$ are slightly better than what is achieved with conventional APC. As such it is seen from these simulation results that TCI feedforward correction can be expected to provide devices with significantly reduced average power consumption (represented by $I_{on}$ in Table 1), significantly reduced average parasitic capacitance, and relatively small leakage current as compared to the No APC and Conventional APC results of Table 1.

The above disclosure is to be taken as illustrative of the invention, not as limiting its scope or spirit. Numerous modifications and variations will become apparent to those skilled in the art after studying the above disclosure.

By way of example, the drive-current improvement steps of Gardner U.S. Pat. No. 5,863,824 may be employed concurrently with use of the TCI feedforward correction schemes disclosed herein. The CD control steps of Toprac U.S. Pat. No. 5,926,690 may be additionally or alternatively employed concurrently with use of one of the TCI feedforward correction schemes disclosed herein.

Given the above disclosure of general concepts and specific embodiments, the scope of protection sought is to be defined by the claims appended hereto.

What is claimed is:

1. A computer system for use in a mass production stream wherein upstream production samples each have at least one of a gate structure of directly or indirectly measured length and one or more adjacent gate sidewalls of directly or indirectly measured thickness, and wherein production results of downstream production steps are affected by said at least one of the gate structure length and the one or more gate sidewall thicknesses, said computer system comprising:

(a) error determining means for determining one or more corresponding amounts of error in one or more production samples between the measured sidewall thickness and a pre-specified, target sidewall thickness or between the measured gate length and a pre-defined, target gate length;

(b) error signal forwarding means for feeding forward error signals representing said corresponding amounts of error; and (c) downstream compensating means for receiving said fed forward error signals and for post-compensating for errors, if any, indicated by the fed forward error signals.

2. The computer system of claim 1 wherein said downstream compensating means includes:

(c.1) a Tilted Channel Implant (TCI) subsystem having at least one of variable implant energy parameter and a variable implant dosage parameter, where at least one of said implant parameters is responsive to at least one of said fed forward error signals.

3. The computer system of claim 2 wherein said error determining means includes:

(a.1) first error determining means for determining a first amount of error in one or more production samples between respective measured sidewall thicknesses and the pre-specified, target sidewall thickness.

4. The computer system of claim 3 wherein said error determining means includes:

(a.2) second error determining means for determining a second amount of error in one or more production samples between respective measured gate lengths and the pre-defined, target gate length.

5. The computer system of claim 2 wherein said downstream compensating means includes:

(c.2) energy parameter adjustment calculating means for defining adjustments to said variable implant energy parameter using an interpolation based on one or more empirically established energy adjustments.

6. The computer system of claim 5 wherein (c.2a) said energy adjustment interpolation uses linear or quasi-linear energy adjustment interpolation for interpolating approximate energy adjustments in accordance with a formula of the form:

$$\text{Energy}_a = E_0 * (1 + \beta * e_{Sw}/S_{wT})$$

wherein $E_0$ is a prespecified amount of implant energy used when sidewall thickness error $e_{Sw}$ is zero, wherein said multiplying factor, β may either be a constant or a function of a specified windowing range of the normalized error, $e_{Sw}/S_{wT}$, and where $S_{wT}$ is said target sidewall thickness.

7. The computer system of claim 6 wherein said multiplying factor, β is defined as one or more values selected from the range, $0.05 \leq 0.15$.

8. The computer system of claim 2 wherein said downstream compensating means includes:

(c.2) dosage parameter adjustment calculating means for defining adjustments to said variable implant dosage parameter using an interpolation based on one or more empirically established dosage adjustments.

9. The computer system of claim 8 wherein (c.2a) said dosage adjustment interpolation uses linear or quasi-linear dosage adjustment interpolation for interpolating approximate dosage adjustments in accordance with a formula of the form:

$$\text{Dose}_a = \text{Dose}_0 * (1 + \alpha(L_{2T} - L_{2M})/L_{2T})$$

wherein $\text{Dose}_0$ is a prespecified amount of implant dosage used when gate length error $L_{2T} - L_{2M}$ is zero, wherein said second multiplying factor, α may either be a constant or a function of a specified windowing range of the normalized error, $(L_{2T} - L_{2M})/L_{2T}$, where $L_{2T}$ is said target gate length and where $L_{2M}$ is derived from one or more measured gate lengths.

10. The computer system of claim 9 wherein said second multiplying factor, $\alpha$ is defined as one or more values selected from the range, $0.05 \leq \alpha \leq 0.15$.

11. An instructions conveying article for conveying instructions to a compatible and configurable computer system, where said computer system is for use in a mass production stream wherein upstream production samples each have at least one of a gate structure of directly or indirectly measured length and one or more adjacent gate sidewalls of directly or indirectly measured thickness, and wherein production results of downstream production steps are affected by said at least one of the gate structure length and the one or more gate sidewall thicknesses said conveying instructions causing the computer system to perform the steps of:

(a) determining one or more corresponding amounts of error in one or more production samples between the measured sidewall thickness and a pre-specified, target sidewall thickness or between the measured gate length and a pre-defined, target gate length; and (b) feeding forward error signals representing said corresponding amounts of error to a downstream compensating means, where said downstream compensating means post-compensates for errors, if any, indicated by the fed forward error signals.

12. An improved, second mass production process that may be compared against a realistically-hypothecated or real first mass production process, where each of the first and second mass production processes are for producing integrated circuit devices (IC's) of substantially similar design, and where while in production, the produced IC's of both the first and second processes each have, while the in-production IC's are each in a first product-precursor form, at least one of a gate structure of directly or indirectly measured length and one or more adjacent gate sidewalls of directly or indirectly measured thickness, and wherein for production results of downstream production steps of the first and second processes, which production results are derived from the first product-precursor form, said production results of each of the first and second processes are affected by said at least one of the gate structure length and the one or more gate sidewall thicknesses of the first product-precursor form, wherein the first and second mass production processes are each respectively characterized by at least below aspects (1.1) and (1.5) as well as by at least one or the other of below aspects (1.3) and (1.4):

(1.1) having a first predefined range respectively selected from respective first and second sets of process tolerance ranges of the respective first and second mass production processes, the first predefined range being applicable to a second product-precursor form and being denoteable as $e_1 \leq e_{GatePR} \leq e_2$, where $e_{GatePR} = L_{PRT} - CD_{PRT}$, represents a difference between an ideal length, $L_{PRT}$ and a correspondingly measured length, $CD_{PRT}$, for a developed photoresist feature, of the second product-precursor form, either before or after a PR trimming process is carried out on said developed photoresist feature, (1.1A) and wherein the first mass production process is further characterized by a deeming as out of tolerance, those measured specimens of the second product-precursor form whose measured length, $CD_{PRT}$, causes $e_{GatePR}$ to be outside said first predefined range of the first set of process tolerance ranges;

(1.2) having a second predefined range respectively selected from the respective ones of said first and second sets of process tolerance ranges, the second predefined range being applicable to a third product-precursor form and being denoteable as $e_3 \leq e_{GateEtched} \leq e_4$ where $e_{GateEtched} = L_{2'T} - L_{2'M}$, and thereby represents a difference between an ideal length, $L_{2'T}$ and a correspondingly measured length, $L_{2'M}$, for an etched gate feature of the third product-precursor form, (1.2A) and wherein the first mass production process is further characterized by a deeming as out of tolerance, those measured specimens of the third product-precursor form whose measured length, $L_{2'M}$ causes $e_{GateEtched}$ to be outside said second predefined range of the first set of process tolerance ranges;

(1.3) having a third predefined range respectively selected from the respective ones of said first and second sets of process tolerance ranges, the third predefined range being applicable to a fourth product-precursor form and being denoteable as $e_5 \leq e_{Depo} \leq e_6$ where $e_{Depo} = F_{wT} - F_{wM}$ and thereby represents a difference between an ideal deposition thickness, $F_{wT}$ and a correspondingly measured deposition thickness, $F_{wM}$, for a sidewall precursor film, of the fourth product-precursor form, (1.3A) and wherein the first mass production process is further characterized by a deeming as out of tolerance, those measured specimens of the fourth product-precursor form whose measured deposition thickness, $F_{wM}$ causes $e_{Depo}$ to be outside said third predefined range of the first set of process tolerance ranges;

(1.4) having a fourth predefined range respectively selected from the respective ones of said first and second sets of process tolerance ranges, the fourth predefined range being applicable to a fifth product-precursor form and being denoteable as $e_7 \leq e_{SW\_trim} \leq e_8$ where $e_{SW\_trim} = S_{wM} - S_{wT}$ and thereby represents a difference between an ideal post sidewall-trim thickness, $S_{wT}$ and a correspondingly measured post sidewall-trim thickness, $S_{wM}$, for one or more trimmed sidewalls of the fifth product-precursor form, (1.4A) and wherein the first mass production process is further characterized by a deeming as out of tolerance, those measured specimens of the fifth product-precursor form whose measured post sidewall-trim thickness, $S_{wM}$ causes $e_{SW\_trim}$ to be outside said fourth predefined range of the first set of process tolerance ranges;

(1.5) having a Tilted Channel Implant (TCI) performed on the first product-precursor form after at least one of said etched gate feature and said one or more trimmed sidewalls are formed;

said improved, second mass production process being further characterized by:

(a) performing an adjusting of at least one of TCI energy and TCI dosage in response to deviation from a corresponding ideal dimension as detected by a corresponding one or more of said production measurement steps in corresponding and present ones of characterization aspects (1.1)–(1.5); and (b) wherein at least one of the first through fourth predefined tolerance ranges in the second set of process tolerance ranges is wider than a corresponding predefined tolerance range in the first set of process tolerance ranges.

13. The improved, second mass production process of claim 12 wherein said adjusting of the recited TCI parameters includes automatic adjusting of TCI energy in response to deviation in sidewall thickness using an interpolation based on one or more empirically established energy adjustments.

14. The improved, second mass production process of claim 13 wherein said energy adjustment interpolation uses linear or quasi-linear energy adjustment interpolation for interpolating approximate energy adjustments in accordance with a formula of the form:

$$\text{Energy}_a = E_0 * (1 + \beta * e_{Sw}/S_{wT})$$

wherein $E_0$ is a prespecified amount of implant energy used when sidewall thickness error $e_{Sw}$ is zero, wherein said multiplying factor, $\beta$ may either be a constant or a function of a specified windowing range of the normalized error, $e_{Sw}/S_{wT}$.

15. The improved, second mass production process of claim 12 wherein said adjusting of the recited TCI parameters includes automatic adjusting of TCI dosage in response to deviation in gate length using an interpolation based on one or more empirically established energy adjustments.

16. The improved, second mass production process of claim 15 wherein said dosage adjustment interpolation uses linear or quasi-linear dosage adjustment interpolation for interpolating approximate dosage adjustments in accordance with a formula of the form:

$$\text{Dose}_a = \text{Dose}_0 * (1 + \alpha(L_{2T} - L_{2M})/L_{2T})$$

wherein $\text{Dose}_0$ is a prespecified amount of implant dosage used when gate length error $L_{2T} - L_{2M}$ is zero, wherein said second multiplying factor, $\alpha$ may either be a constant or a function of a specified windowing range of the normalized error, $(L_{2T} - L_{2M})/L_{2T}$, where $L_{2T}$ is said target gate length and where $L_{2M}$ is derived from one or more measured gate lengths.

17. The improved, second mass production process of claim 12 wherein each of said first and second mass production processes is characterized by aspect (1.2).

18. The improved, second mass production process of claim 17 wherein under-etched specimens of the third product-precursor form are further etched and remeasured for error.

19. The improved, second mass production process of claim 12 wherein over-deposited specimens of the of the fourth product-precursor form are exposed to a compensating, isotropic pre-etch before said sidewalls are formed by anisotropic trimming.

* * * * *